(12) United States Patent
Mizuyama et al.

(10) Patent No.: US 7,436,423 B2
(45) Date of Patent: Oct. 14, 2008

(54) APPARATUS AND METHOD OF MAKING A GRAYSCALE PHOTO MASK AND AN OPTICAL GRAYSCALE ELEMENT

(75) Inventors: Yosuke Mizuyama, Cambridge, MA (US); Xinbing Liu, Acton, MA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 230 days.

(21) Appl. No.: 11/134,310

(22) Filed: May 23, 2005

(65) Prior Publication Data

US 2006/0263698 A1 Nov. 23, 2006

(51) Int. Cl.
*G02B 6/00* (2006.01)
*G03F 1/00* (2006.01)

(52) U.S. Cl. .................... 347/238; 372/18; 372/50.123; 372/50.124

(58) Field of Classification Search ................. 347/224, 347/225, 233, 228; 372/50.23, 50.124; 385/147
See application file for complete search history.

(56) References Cited

U.S. PATENT DOCUMENTS 5,272,667 A * 12/1993 Yamada et al. .............. 365/113

(Continued)

FOREIGN PATENT DOCUMENTS

EP 0558781 9/1993

OTHER PUBLICATIONS

V.P. Korolkov, et al, "Application of gray-scale LDW-glass masks for fabrication of high-efficiency DOEs," Institute of AUtomation and Electrometry SB RAS, Novosilbirsk, 630090, Russia Canyon Materials Inc., San Diego, CA 92121, USA, Jan. 1999, pp. 129-138.*

(Continued)

*Primary Examiner*—Mark F. Huff
*Assistant Examiner*—Caleen O Sullivan
(74) *Attorney, Agent, or Firm*—Dickinson Wright, PLLC

(57) ABSTRACT

An apparatus and method for making a grayscale photo mask and a three-dimensional grayscale diffractive optical element operate as follows. A grayscale photo mask is obtained by exposing a laser direct write (LDW) glass material to laser beam radiation from a first laser beam of modulated power moved over a grid of discrete locations on the LDW material, the modulated power being in accordance with grayscale pattern data, and, while the first laser beam is moved over the discrete locations of the grid, exposing the grid to a second laser beam, the power of the second laser beam being less than the bleach threshold of the glass material, to provide each of the discrete locations with a gray scale level to provide a predetermined gray scale pattern of varying optical transmissivity on the LDW material to produce a grayscale mask. An optical element is obtained by exposing a photoresist layer on a wafer to radiation transmitted through the grayscale mask; and removing material from the photoresist layer to provide a predetermined varying thickness of the photoresist layer as determined by the gray scale patterns on the grayscale mask to produce the three-dimensional grayscale diffractive optical element. The optical element may be a diffraction grating. The power of the second laser exposed on said discrete locations may be between about 50 mW and about 5 W, and the power of the first laser exposed on the discrete locations may be between about 20 mW and about 500 mW.

4 Claims, 17 Drawing Sheets

U.S. PATENT DOCUMENTS

| | | | | |
|---|---|---|---|---|
| 5,745,152 | A | * | 4/1998 | Vincent et al. ............... 347/238 |
| 6,490,390 | B1 | | 12/2002 | Wilcox |
| 6,524,756 | B1 | | 2/2003 | Wu |
| 6,560,248 | B1 | * | 5/2003 | Vernackt ...................... 372/18 |
| 6,562,523 | B1 | | 5/2003 | Wu et al. |

OTHER PUBLICATIONS

V.P. Korolkov, et al.; "Application of gray-scale LDW-glass masks for fabrication of high-efficiency DOEs," Institute of Automation and Electrometry SB RAS, Novosibirsk, 630090, Russia Canyon Materials Inc., San Diego, CA 92121, USA, Jan. 1999, pp. 129-138.

* cited by examiner

Arbitrary pattern 8 level grayscale pattern

Bleach test with different laser power

Binary

Blazed (continuous)

Blazed (5 levels)

APPARATUS AND METHOD OF MAKING A GRAYSCALE PHOTO MASK AND AN OPTICAL GRAYSCALE ELEMENT

BACKGROUND OF THE INVENTION

1. Field of the Invention

The present invention is directed to an apparatus and method for making grayscale photo masks used as a light filter to transfer an image from one device to another and optical elements made using such masks.

2. Discussion of the Related Art

Conventional photolithographic technology is based on binary photolithography, which basically produces a step-like binary structure on a material of interest. Grayscale technology is a type of photolithographic technology that is mainly used in the opto-electronics industry. Grayscale photolithography has been developed to make multi-level steps or ultimately a continuous structure.

FIG. 16 illustrates a conventional binary photolithographic process, and FIG. 19 shows an example of a binary diffraction grating made with a binary photo mask.

As illustrated in FIG. 16, a type of conventional binary photo mask is made by a glass wafer with a chromium pattern on the wafer, where the transmission is binary, i.e., 0 or 1. In FIG. 16, step 1 involves preparation of a wafer (for example, glass) on the surface of which a micro-structure is to be formed. In step 2, the wafer is placed on a vacuum chuck, and then, using a spin-coater, a photo resist is spin-coated onto the wafer, by dropping resist drops onto the spinning wafer. Step 3 represents preparation of the photo mask. An exposure step (step 4) is performed using a mask aligner or a stepper by exposing the photo resist with light of a certain wavelength through a photo mask loaded on an optical system to project light onto the photo resist on the wafer to make a desired pattern on the photo resist corresponding to the pattern formed on the photo mask in advance. A development step (step 5) is performed to develop the photo resist on the wafer, where the exposed portion is removed and the unexposed portion stays on the wafer. Next, an etching step (step 6) is performed to etch the wafer with developed photo resist using any plasma etcher or chemical etcher, where the remaining photo resist plays a role to avoid being exposed in the plasma or chemical etcher while bare parts of the wafer are etched to make a structure corresponding to the original pattern on the photo mask.

An example of a photolithographic process is described in European Patent Application 0 588 781 which discloses a method for exposure of a pattern by writing with a focused laser light onto a photosensitive substrate. During the writing procedure, the substrate is moved in a first direction, and the optics are continuously moved to focus laser light on the photosensitive surface in a second direction orthogonal to the first direction. The focused laser light is spread on the photosensitive surface in the first direction to form an extended focus area, and the focused laser light is independently controlled to hit position increments spaced in the first direction across the extended focus area. Another example is described in U.S. Pat. No. 6,490,390 which discloses an optical interferometric system for fabricating fiber Bragg gratings in photosensitive optical fibers by using an acousto-optic element to generate and control the radiation pattern with a high resolution. The radiation pattern may be programmable in that different radiation patterns may be produced by controlling the acousto-optic element. The fiber is exposed to an interference pattern to write a grating pattern in the fiber.

A gray scale photo mask is a mask that has a desired pattern provided on a given material described by the transmission of light and is used to project light onto a massive number of wafers having a photo resist thereon. A grayscale photo mask may be made using any number of materials using a technique to alter the transmission of the material to be multi-level or gray-level.

FIG. 18 shows a conventional grayscale photolithographic process to make a grayscale photo mask, using LDW (Laser Direct Write) glass. LDW glass is a kind of grayscale photo mask material made by Canyon Materials Inc., San Diego, Calif. Such materials and their use are described in U.S. Pat. No. 6,524,756, U.S. Pat. No. 6,562,523 and Korolkov et al., "Application of gray-scale LDW-glass masks for fabrication of high-efficiency DOEs," Institute of Automation and Electrometry SB RAS, Novosibirsk, 630090, Russia, January, 1999.

The base transmission of LDW glass is set at a desired optical density (OD) at a certain wavelength, normally OD=2.0, for example, which means incident light transmits only approximately 1% through the glass. The transmission of LDW glass illuminated by a laser changes in accordance with the laser power. As the laser power increases, LDW glass turns more transparent. By traversing the surface of the LDW blank while modulating the laser power in accordance with desired patterns, a grayscale photo mask is obtained whose transmission varies across the surface of the LDW glass corresponding to a desired pattern. In this way, a grayscale optical density, or alternatively grayscale transmission, can be attained. This allows a grayscale structure to be made on the photo resist on a wafer to make a grayscale optical element by final etching. FIG. 17 shows the relation between transmittance and laser power of an LDW material.

More particularly, in order to make a grayscale photo mask using LDW glass, a focused laser beam is required. The laser should have a certain power to bleach LDW glass that has a threshold energy to be bleached within a practical writing time. Also, the laser should have sufficient focusing power to write a very fine pattern, e.g., having a beam spot of 1 micron or less. An Acousto-Optic Modulator (AOM) modulates the laser beam to vary the intensity of the transmitted laser beam applied to the LDW glass surface. The laser writer for writing on the LDW glass includes a laser, an AOM, a scanning mirror, a focusing lens, a translation stage, and a precise positioning mechanism using, for example, an interferometer and a computer. An example of a laser writer is that made by Microtech (Italy) having a 150 mW He—Cd laser with a 442 nm wavelength.

With respect to the writing method, to write up a pattern on the LDW blank, a raster scanning method may be used. The scanning speed depends on how fast it is desired to write the pattern, for example, a 39 cm/s scan using an objective lens of NA=0.65 (NA shows focusing power) and a gas laser of 150 mW power to make a grayscale pattern with a full range of OD=2.0.

SUMMARY OF THE INVENTION

The present invention is directed to providing a fast and inexpensive method of using a laser writer to produce an LDW grayscale photo mask with high spatial resolution, and to use such grayscale photo mask in the fabrication of optical or opto-electronic elements.

According to the present invention, there is provided a method of making a grayscale photo mask, comprising providing a LDW glass material having a body portion and a surface layer formed thereon which is responsive to heat from laser beam radiation to change the optical density of the LDW glass material; exposing the surface layer of the LDW glass material to a first laser beam moved over a plurality of locations on the surface layer of the LDW glass material while modulating power of the first laser beam in accordance with grayscale pattern data; and while the first laser beam is moved over the locations on the surface layer, exposing the LDW glass material to a second laser beam, the power of the second laser beam being less than a bleach threshold of the LDW glass material, whereby each of the locations is provided with a gray scale level to provide a predetermined gray scale pattern of varying optical transmissivity on the plurality of locations of the LDW glass material to produce a gray scale mask.

According to the present invention, there is further provided a method of making a grayscale photo mask, comprising providing a LDW glass material having a body portion and a surface layer formed thereon which is responsive to heat from laser beam radiation to change the optical density of the LDW glass material; exposing the surface layer of the LDW glass material to a first laser beam moved over a plurality of locations on the surface layer of the LDW glass material while modulating power of the first laser beam in accordance with grayscale pattern data; and while the first laser beam is moved over the locations on the surface layer, exposing the LDW glass material to a second laser beam, the power of the second laser beam being less than a bleach threshold of the LDW glass material, whereby each of the locations is provided with a gray scale level to provide a predetermined gray scale pattern of varying optical transmissivity on the plurality of locations of the LDW glass material to produce a gray scale mask; providing a wafer having a photo resist layer thereon; exposing the photoresist layer to radiation transmitted through the grayscale mask; and removing material from the photoresist layer to provide a predetermined varying thickness of the photoresist layer as determined by the gray scale patterns on the gray scale mask to produce the three-dimensional grayscale diffractive optical element.

According to the present invention, there is also provided an apparatus for making a grayscale photo mask, the apparatus comprising: a first laser that emits a laser beam; a modulator that modulates the power of the laser beam in accordance with grayscale pattern data to produce a first laser beam of modulated power; a drive section that moves the first laser beam of modulated power over a plurality of locations on a surface layer of an LDW glass material to change the optical density of the LDW glass material at the plurality of locations; and a second laser that, while the first laser beam is moved over the plurality of locations on the surface layer of the LDW glass material, exposes the LDW glass material to a second laser beam, the power of the second laser beam being less than a bleach threshold of the LDW glass material, whereby each of the plurality of locations is provided with a gray scale level to provide a predetermined gray scale pattern of varying optical transmissivity on the LDW glass material to produce a gray scale mask.

According to the present invention, there is further provided an apparatus for making a three-dimensional grayscale diffractive optical element, comprising: (a) an apparatus for making a grayscale photo mask comprising: a first laser that emits a laser beam; a modulator that modulates the power of the laser beam in accordance with grayscale pattern data to produce a first laser beam of modulated power; a drive section that moves the first laser beam of modulated power over a plurality of locations on a surface layer of an LDW glass material to change the optical density of the LDW glass material at the plurality of locations; and a second laser that, while the first laser beam is moved over the plurality of locations on the surface layer of the LDW glass material, exposes the LDW glass material to a second laser beam, the power of the second laser beam being less than a bleach threshold of the LDW glass material, whereby each of the plurality of locations is provided with a gray scale level to provide a predetermined gray scale pattern of varying optical transmissivity on the LDW glass material to produce a gray scale mask; (b) an exposing section that exposes the photoresist layer to radiation transmitted through the grayscale mask; and (c) a removing section that removes material from the photoresist layer to provide a predetermined varying thickness of the photoresist layer as determined by the gray scale patterns on the gray scale mask to produce the three-dimensional grayscale diffractive optical element.

The LDW glass material may have another surface layer on the body portion and the second laser beam may be exposed on the another surface layer of the LDW glass material. The another surface layer may be a back side of the LDW material relative to the surface layer which is exposed to the first laser beam. The second laser beam may expose a wider area of the LDW glass material than the first laser beam. The second laser beam may expose the LDW glass material to the second laser beam for a period of time prior to exposure of the LDW material to the first laser beam.

The optical element may be a diffraction grating. The power of the second laser exposed on the discrete locations may be between about 50 mW and about 5 W, and the power of the first laser exposed on the discrete locations may be between about 20 mW and about 500 mW.

BRIEF DESCRIPTION OF THE DRAWINGS

The above and other objects, features and advantages of the present invention will be more clearly understood from the following detailed description taken in conjunction with the accompanying drawings, described in brief below.

DETAILED DESCRIPTION

Figure 1:
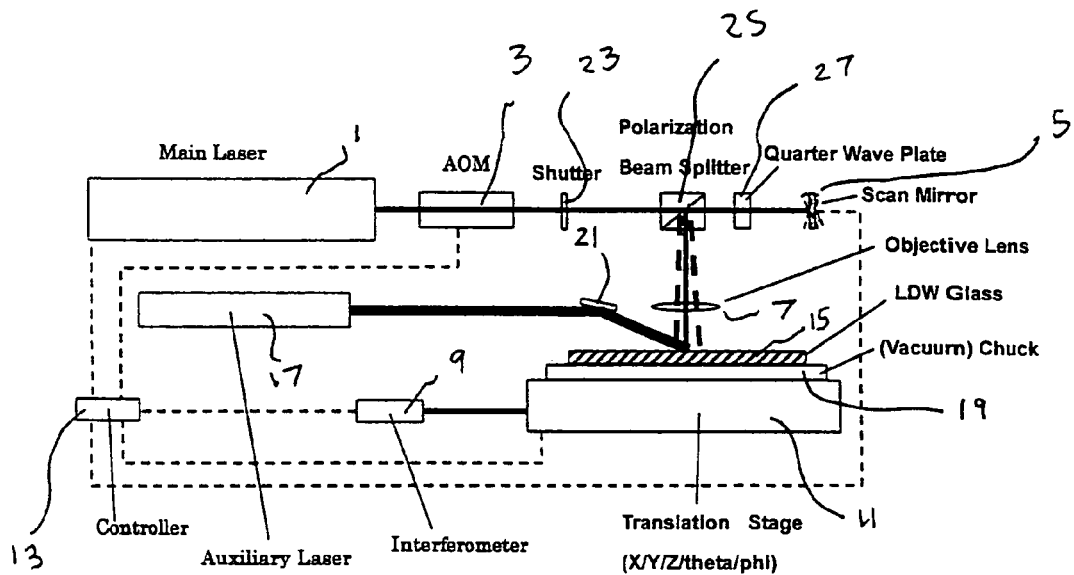
FIG. 1 shows a preferred embodiment of the apparatus of this invention for making a grayscale element.

FIG. 1 shows a preferred embodiment of the apparatus of this invention for making a grayscale photo mask on an LDW blank which is a plate having a body portion and a surface layer formed thereon which is responsive to heat to change the optical density of the LDW glass material. This apparatus includes a high power main (first) laser 1 (which may be gas or semiconductor) with power of, e.g., 20 mW to 500 mW; an acousto-optic modulator (AOM) 3; a shutter 23; a polarization beam splitter 25; a quarter wave plate 27; a scanning mirror 5; an objective lens 7; an interferometer 9 (including a laser and a detector); a translation stage 11 (including all axes); a computer 13; an auxiliary (second) laser 17; and a reflection mirror 21. FIG. 1 shows an LDW glass plate 15 (which may be of any desired size, e.g., 5 or 6 inches square), held onto the translation stage 11 by a vacuum chuck 19, for being processed to form the grayscale photo mask.

The method of using this apparatus is as follows, with reference to FIGS. 1, 2, 3 and 4. Grayscale data for creating the mask is prepared and stored in computer 13. Patterns are written on LDW glass plate 15 with a focused laser beam by modulating the laser beam from main laser 1 using AOM 3 based on the data stored in computer 13 and raster scanning in one direction while the translation stage 11 moves in the other direction (see FIG. 3). Interferometer 9 corrects the writing position in real time to achieve precise alignment.

Figure 4:
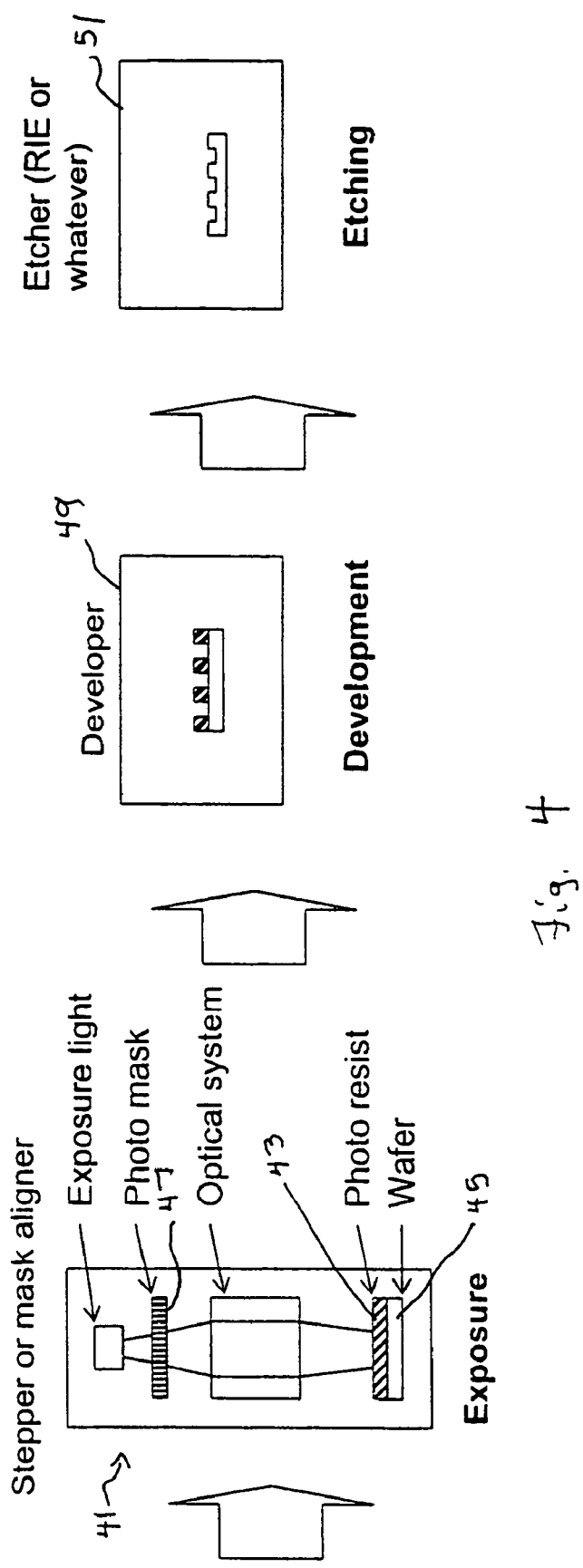
Figure 5C:
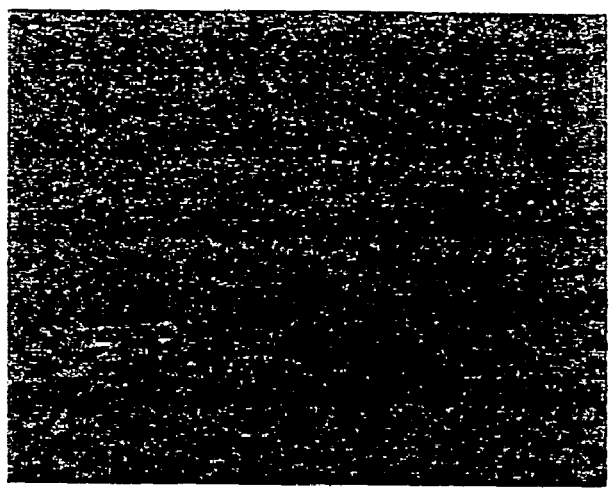
FIGS. 5A, 5B and 5C show examples of grayscale patterns on LDW glass that may be formed according to the present invention.
Figure 5B:
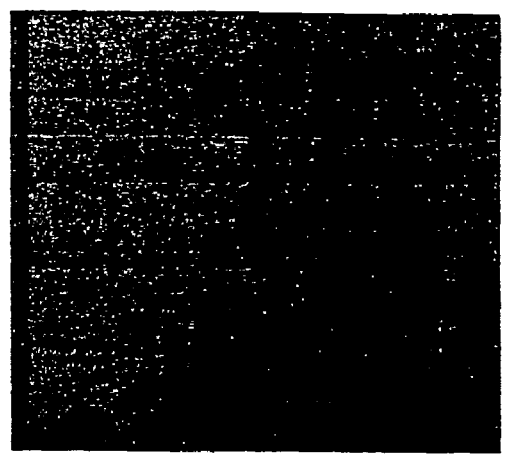
Figure 5A:
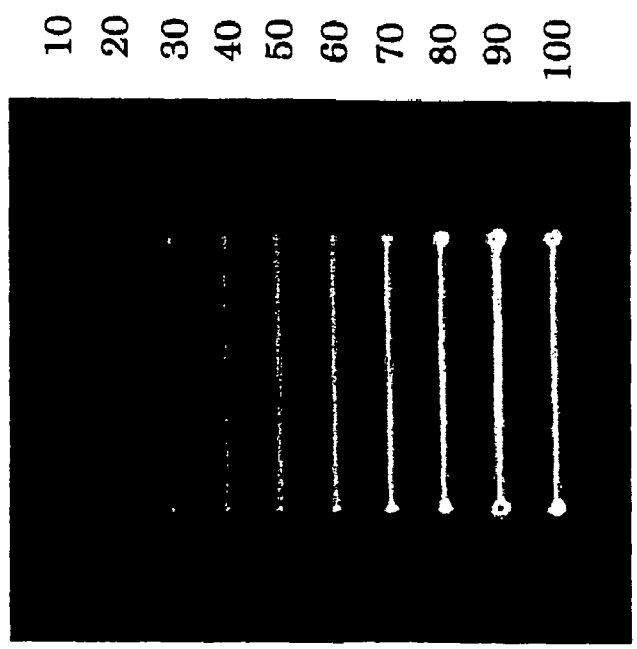
Figure 19:
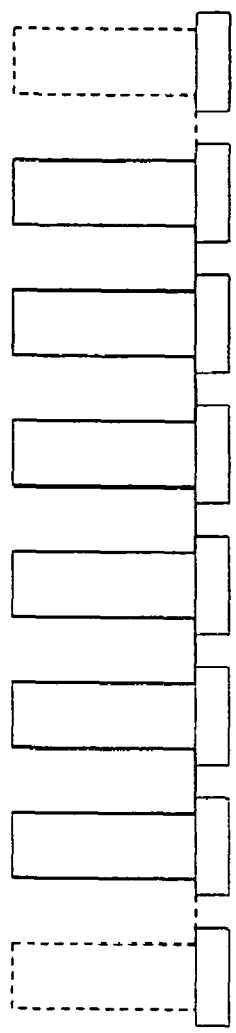
FIG. 19 shows an example of a binary diffraction grating made with a binary photo mask.

As shown in FIG. 4, the exposure step involves exposing photo resist 43 on a wafer 45 in a stepper (1× optical system) or mask aligner 41 (5× or 10× optical system) through an LDW grayscale photo mask 47 made by the method described above. Then, the exposed photo resist on the wafer is developed in a developer 49, and thereafter, the wafer together with the developed photo resist on the wafer is etched in etcher 51 using any etching method such as plasma etching, for example, RIE (Reactive Ion Etching) and wet etching using chemicals.

Referring again to FIG. 1, auxiliary laser 17 performs an auxiliary heating operation of the LDW glass 15 with an amount of heat energy that does not exceed the bleach threshold of the LDW glass 15. The use of the auxiliary laser enables reduction of the power of main laser 1, which avoids certain problems caused by use of a very high power main laser. Also, another disadvantage of a very high power laser 1 is that the optics can be easily damaged and the LDW glass can incur surface deformation due to melting. Also, the higher the laser power, the greater the expense. The main laser beam 1 should be tightly focused down to the surface of LDW glass plate 15 using objective lens 7 to write a fine resolution pattern onto LDW plate 15. Another advantage of the use of auxiliary laser 17 is that the scan speed of the main laser 1 can be increased.

The mechanism of turning color in LDW glass upon illumination of a focused laser beam is the result of heat effect. There is a bleach threshold which is the threshold of the temperature where LDW glass starts to change its color. While illuminating the auxiliary laser on the LDW glass to get its temperature close to the threshold temperature, the main laser is applied to exceed the threshold temperature. Both lasers should be used simultaneously. Otherwise once the auxiliary laser is turned off, the LDW glass could be cooled down very quickly. It is noted that, with respect to heating with a laser beam, there is a decay time of heat dissipation, which is a function of heat capacitance. Glass has a rather long decay time compared to metal. Thus, the auxiliary laser may preheat the glass from a point in time a few ms or a few tens of ms before application of the main laser beam. In other words, the auxiliary beam may be applied, not only during the writing operation of the main beam, but also for a short time prior to beginning of the writing operation with the main beam. Of course, the auxiliary beam covers a wider area than the beam spot of the main beam and thus heats some areas of the LDW glass surface prior to application of the write beam to such areas; thus, the auxiliary laser beam is applied to such areas before the main laser begins to write. The auxiliary beam may be applied a short time before the write operation of the main beam even begins.

Because the LDW glass plate 15 is written by the effect of heat, the main laser 1 can be any type of laser, such as solid state, semiconductor and gas, and its wavelength can be any wavelength provided the laser beam is focused and has a heat effect. The main laser 1 should be a continuous laser that is modulated by AOM 3. The main laser 1 can be, for example, an He—Cd gas laser with 150 mW power, such as model number KR1801C, made from KIMMON Electric Co., Ltd., Japan. Alternatively, the first laser 1 can be directly driven by a laser driver (not shown) in accordance with grayscale pattern data to produce a first laser beam of modulated power, in which case the AOM 3 can be eliminated.

With the aid of auxiliary laser 17, the power of the main laser 1 can range from much lower power, e.g., minimum of about 20 mW up to optionally about 500 mW (but preferably no greater than 150 mW) depending upon the system, whereas, without an auxiliary laser 17, there is a requirement of high power of the single writing laser of around 500 mW. Regarding the power range of 20 mW to 500 mW for the main laser 1, the minimum 20 mW is valid with low scan speed such as 1 cm/s and with the existence of the auxiliary laser 17, while the higher power is limited by 500 mW because otherwise, the optics may be easily damaged and LDW glass may incur deformation due to melting at such higher powers. The main laser beam should be tightly focused onto the surface of the LDW glass using the objective lens to write a finely resolved pattern.

Figure 2:
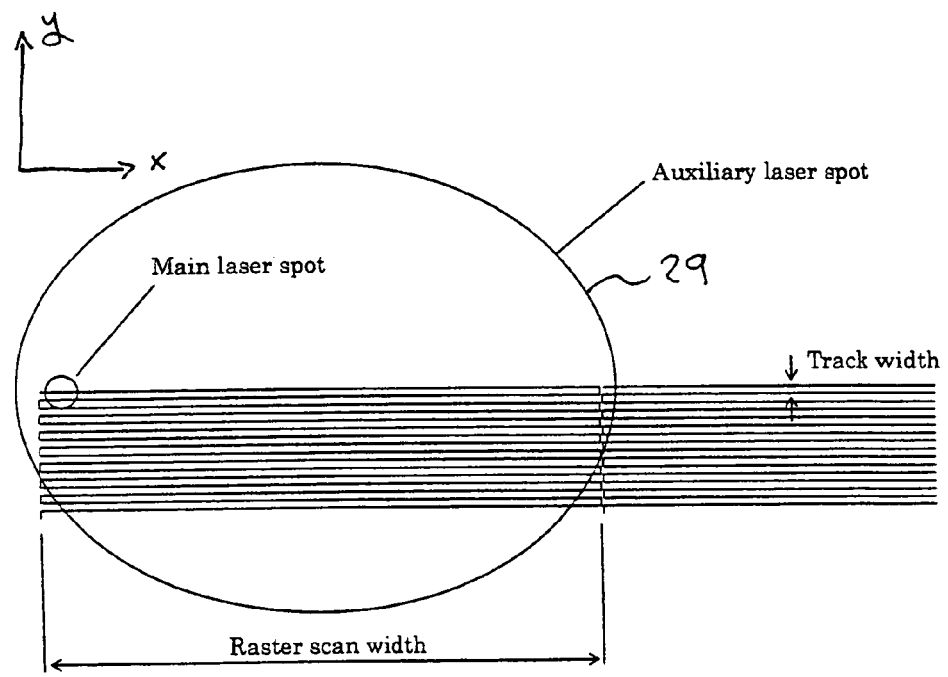
FIGS. 2, 3 and 4 illustrate a method of using the apparatus of FIG. 1.

The auxiliary laser 17 can be any type of laser and can be either a continuous laser or a pulsed laser as long as it provides a heat effect. The laser beam from the auxiliary laser 17 can be collimated or focused using a lens. This auxiliary beam is delivered on the portion of LDW plate 15 where a pattern is being written while making a spot with a spot size 29, as shown in FIG. 2, that covers a wide area, e.g., (strip width)× (track width), written and applied before and while the main laser beam scans one strip. The power of the auxiliary laser 17 can take any level, provided the bleaching power is not exceeded, depending on how much the laser is focused. When the beam of the auxilliary laser is focused tightly, the power can be low. Where the beam is loosely focused or collimated, the power should be large. The laser beam of auxiliary laser 17 should be low enough that it does not cause a phase change on the surface of LDW plate 15 but high enough that LDW plate 15 is locally heated enough to enable the above-discussed significant reduction of the power of the main laser 1.

Figure 3:
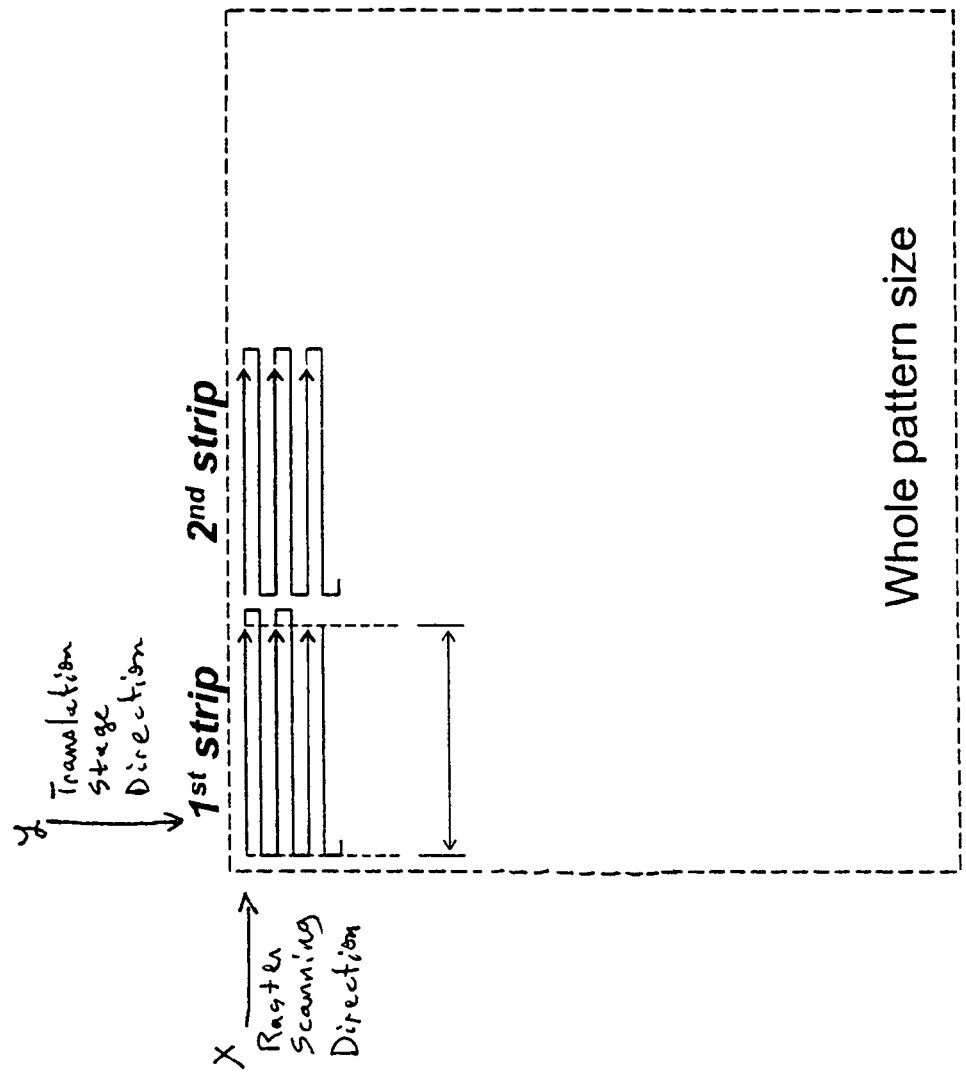

With respect to the writing method, to write up a pattern on the LDW blank, a raster scanning method may be used, in which the main laser beam is raster-scanned in one direction (for example in the x-direction) while the LDW glass moves in the y-direction to scan one strip of the pattern. After finishing the first strip, the LDW glass moves to the starting point of the next strip. In this way, all of the strips are written. FIG. 3 illustrates a raster scan method with a scan speed of 78 cm/s (for a first lens) and 39 cm/s (for a second lens), and a strip width of 200 microns (for the first lens) and 100 microns (for the second lens).

The following table shows some exemplary combinations of parameters and obtained results with He—Cd main laser wavelength of 442 nm and auxiliary laser diode with wavelength of 780 nm for pattern size of 5 mm by 5 mm.

|  |  | Example # | | | | | |
| --- | --- | --- | --- | --- | --- | --- | --- |
|  |  | 1 | 2 | 3 | 4 | 5 | 6 |
| Set parameters | Main Laser power (mW) | 150 | 50 | 50 | 50 | 50 | 50 |
|  | Aux. Laser power (mW) | 0 | 50 | 100 | 100 | 100 | 100 |
|  | Scan speed (cm/s) | 40 | 40 | 120 | 120 | 120 | 120 |
|  | Track separation (um) | 0.1 | 0.1 | 0.1 | 0.2 | 0.2 | 0.2 |
|  | Lens NA | 0.65 | 0.65 | 0.65 | 0.65 | 0.65 | 0.4 |
|  | LDW background OD | 2.0 | 2.0 | 2.0 | 2.0 | 1.0 | 1.0 |
| Obtained result | Feature size on LDW (μm) | 0.5 | 0.5 | 0.5 | 0.5 | 0.5 | 1.0 |
|  | Gray level | 64 | 64 | 64 | 32 | 16 | 8 |
|  | Process time (min) | 60 | 60 | 20 | 10 | 5 | 5 |

Figure 6A:
FIGS. 6A and 6B show examples of grayscale blazed gratings that may be made according to the present invention.
Figure 6B:
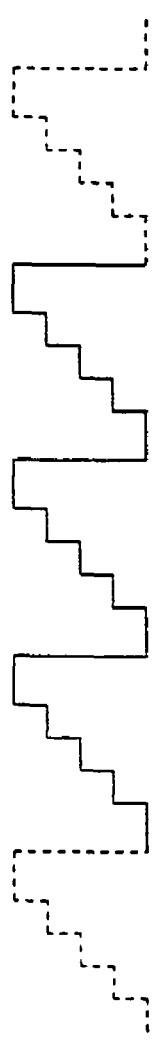
Figure 7:
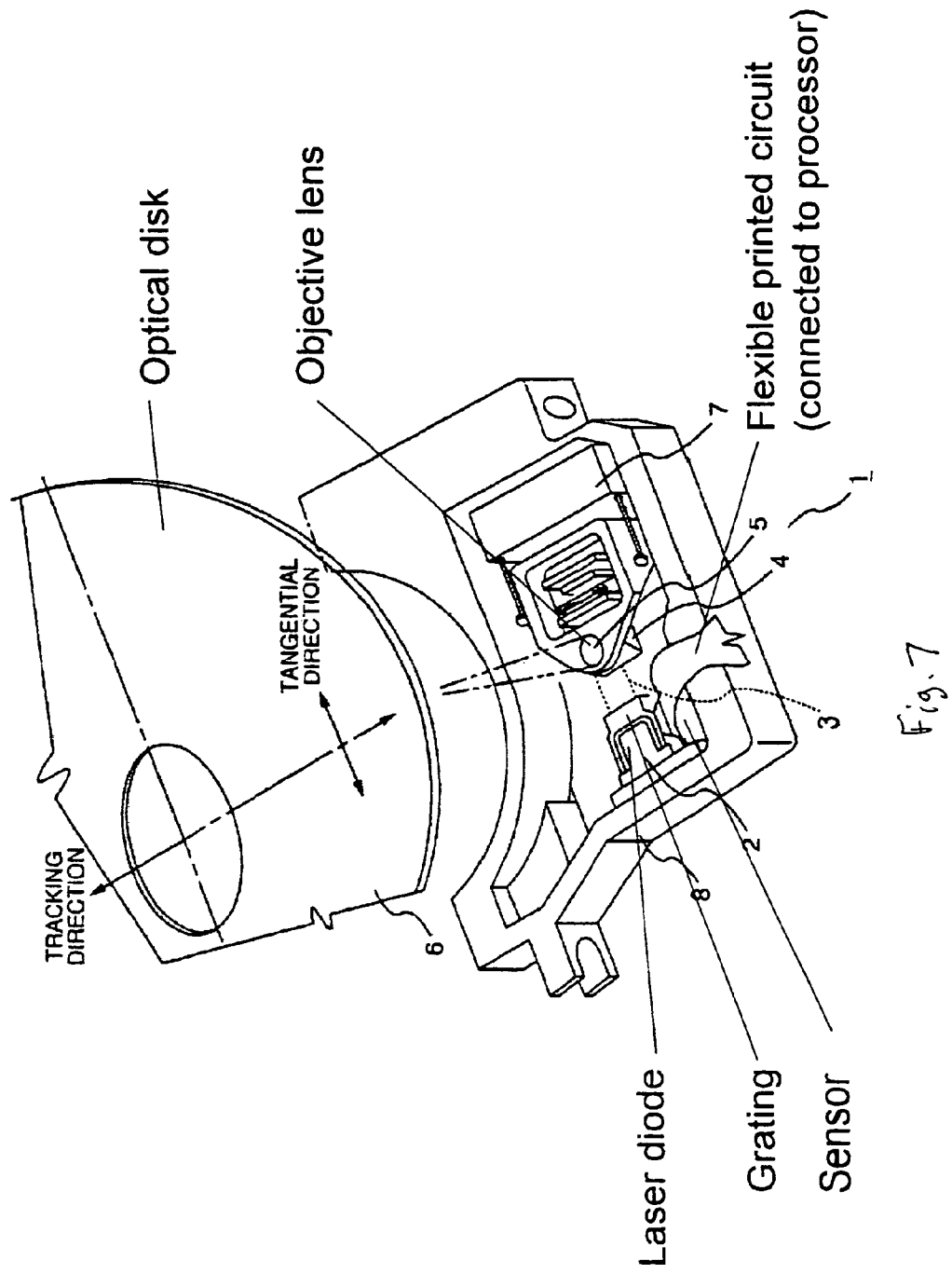
FIG. 7 shows an example of an optical pickup that may employ a grating made according to the present invention.
Figure 8:
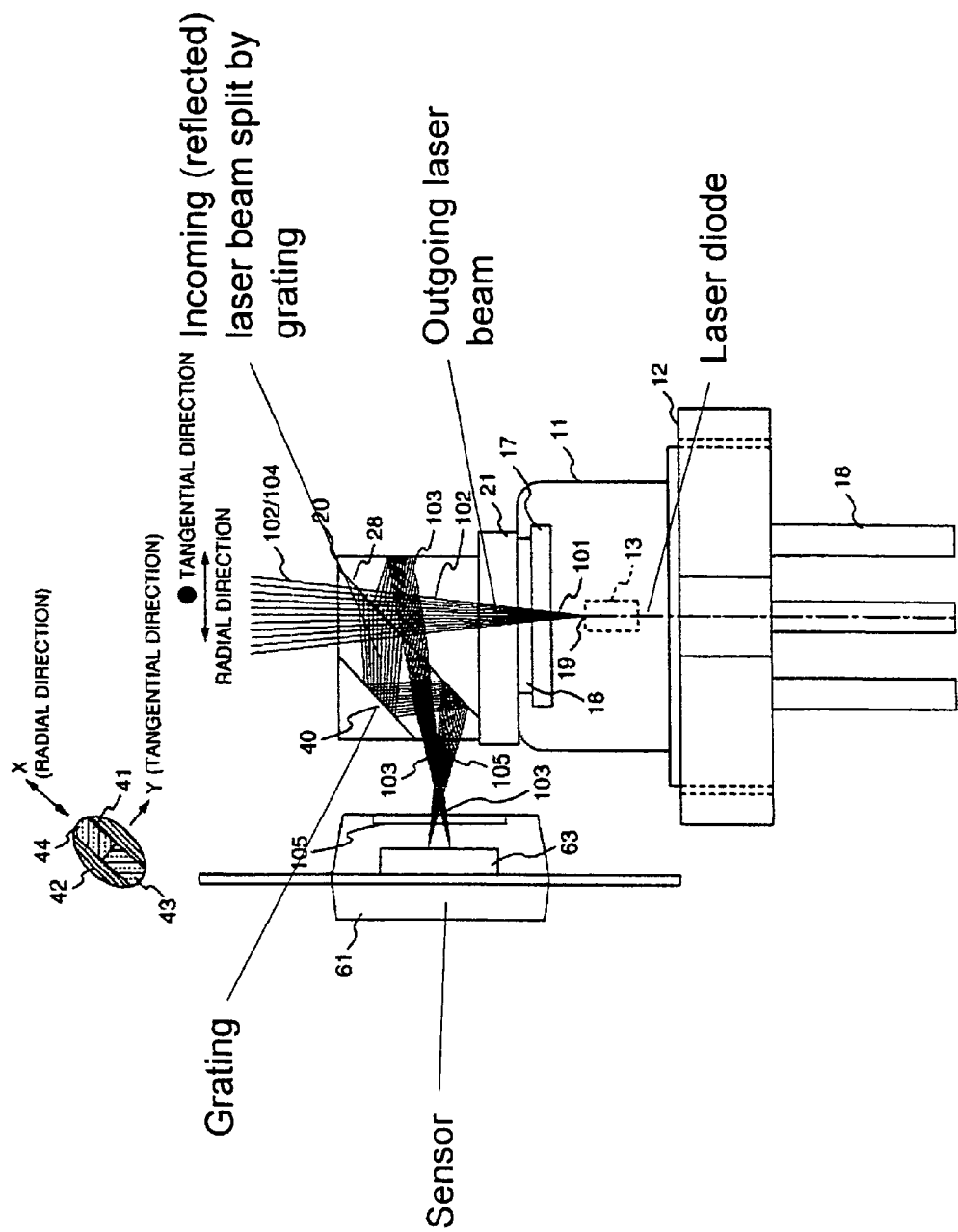
FIG. 8 shows an example of a grating unit that may employ a grating made according to the present invention.
Figure 9:
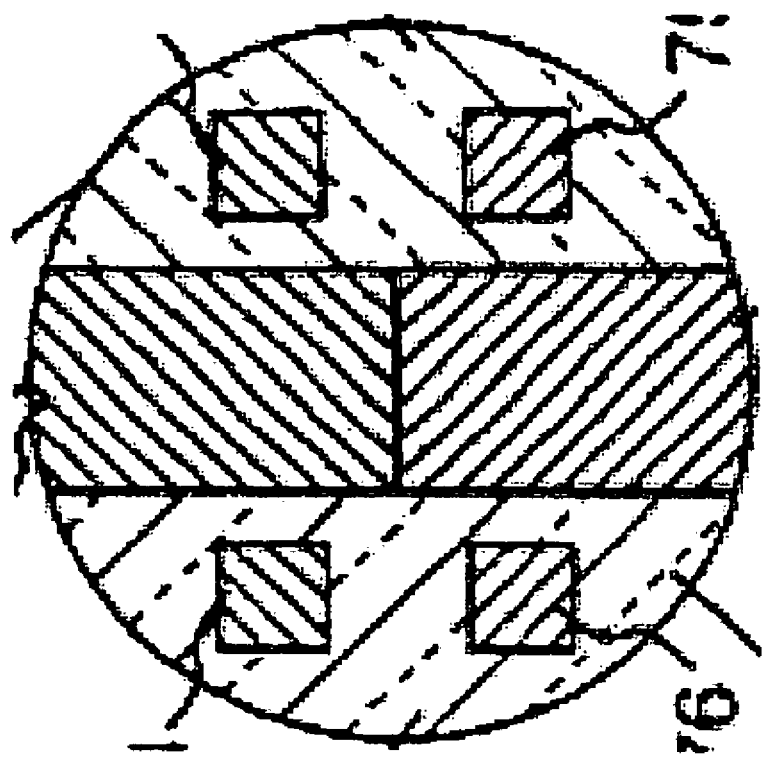
FIG. 9 shows an example of a grating pattern that may be formed according to the present invention.

Products made by the method and apparatus of the present invention are grayscale optical elements, for example, a grating used in an optical pickup in an optical drive such as a CD, a DVD and a Blu-ray (high definition) drive. The grating plays an important role of splitting the laser beam carrying information from an optical disk into a sensor to process the data. A conventional grating used in an optical pickup is a binary type that has a number of periodic rectangular grooves. A problem of binary gratings is low diffraction efficiency, i.e., the grating throws away about 70% of the incident beam. For a CD and a DVD drive, there is a demand to decrease the laser power due to a heat problem that comes from high laser power. Thus, if the diffraction efficiency goes up, a lower power laser can be used, which may relax the problem. For a Blu-ray drive, there is a shortage of laser power due to low reflectivity of optics that causes power loss for this particular wavelength. Thus, there is a need to increase the diffraction efficiency for efficient use of the laser power. One method to improve the diffraction efficiency is to make a so-called blazed grating, which is roof-shaped rather than rectangular groove shape. This blazed grating is made only by grayscale technology. FIGS. 6A and 6B show examples of binary and blazed gratings that may be made according to the present invention. FIG. 7 shows an example of an optical pickup that may employ a grayscale grating produced according to the present invention. FIG. 8 shows an example of a grating unit that may employ a grating produced according to the present invention. FIG. 9 shows an example of a grating pattern that may be formed according to the present invention.

Figure 10B:
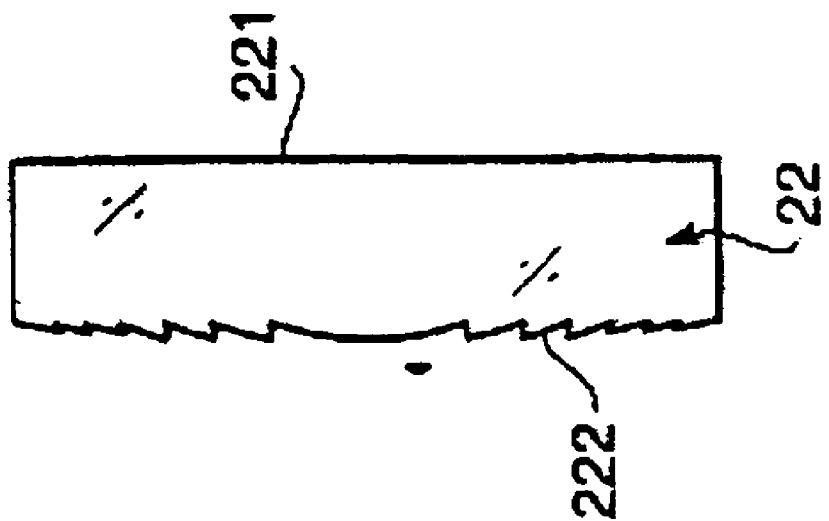
FIGS. 10A and 10B a Fresnel lens that may be made according to the present invention.
Figure 10A:
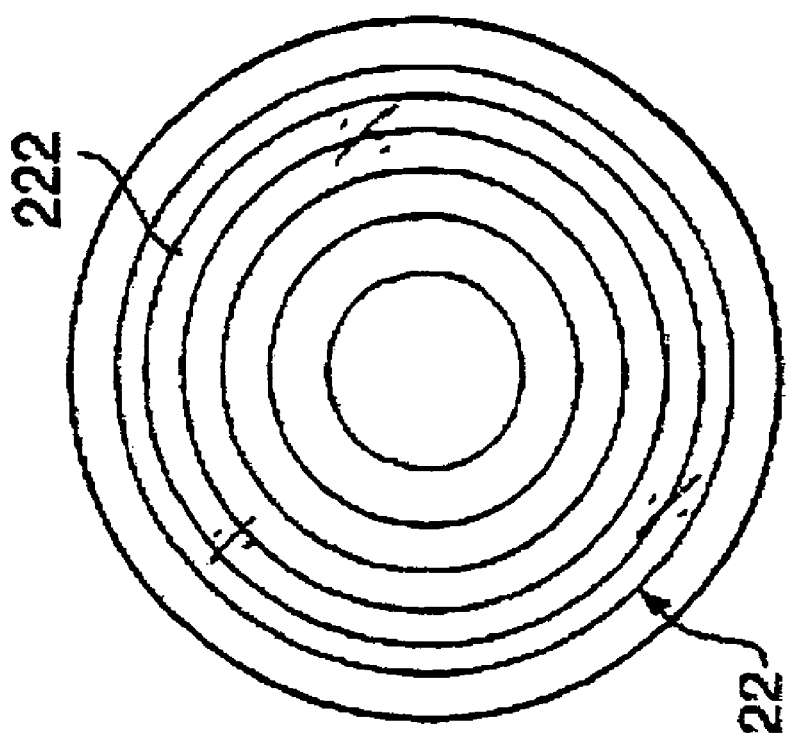
Figure 11:
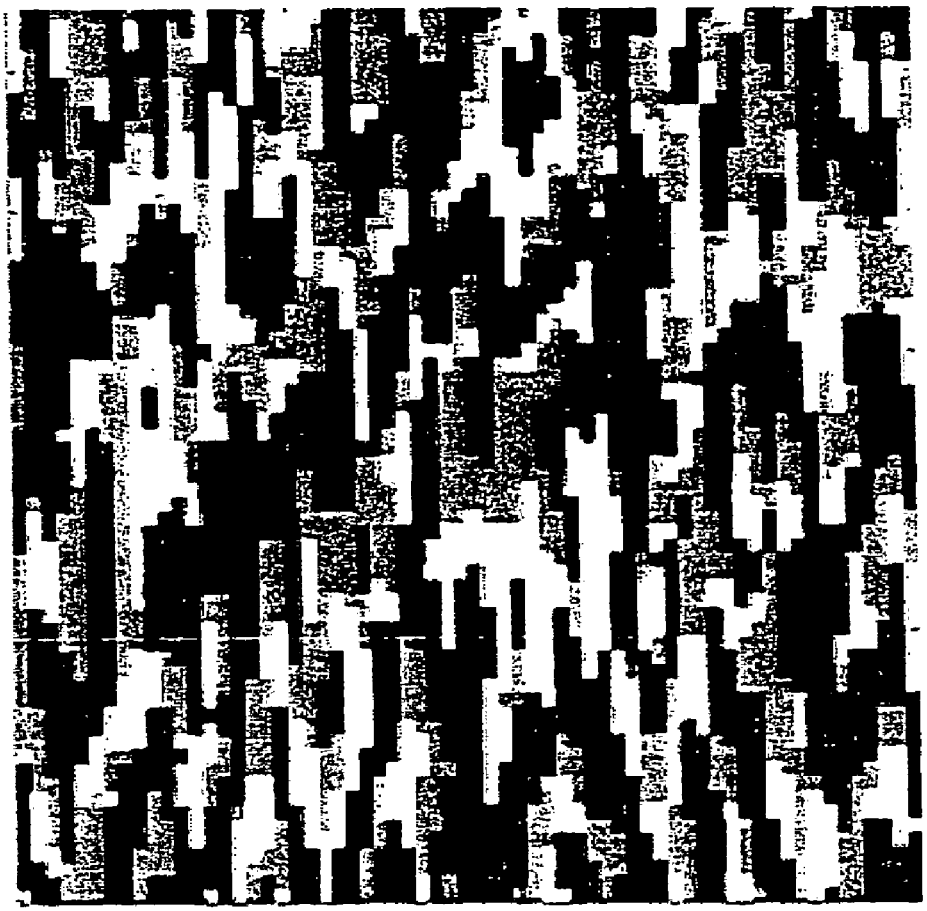
FIG. 11 shows the contour of a 4 level fan-out grating that may be made according to the present invention.

Other products that may be made by the method and apparatus of the present invention include any optics having curved surfaces such as aspheric lenses, aspheric mirrors and any diffractive optics such as fan-out DOEs, Fresnel lenses or Fresnel mirrors. These optics are used in cameras, displays and optical drives. FIGS. 10A and 10B show a Fresnel lens that may be made according to the present invention. FIG. 11 shows the contour of a 4 level fan-out grating that may be made according to the present invention.

Figure 12:
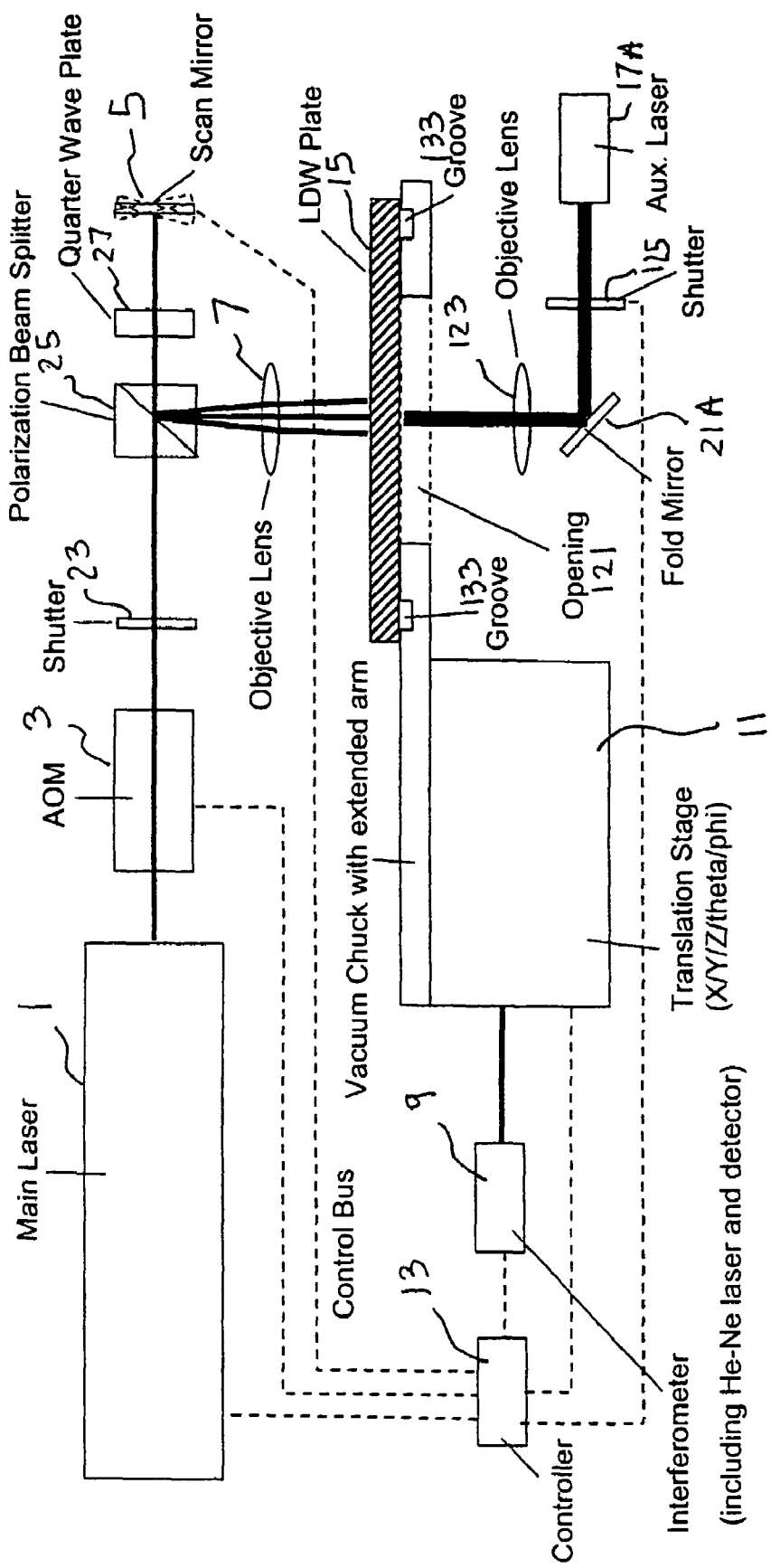
FIG. 12 shows another embodiment of the present invention using illumination from the back side.
Figure 13:
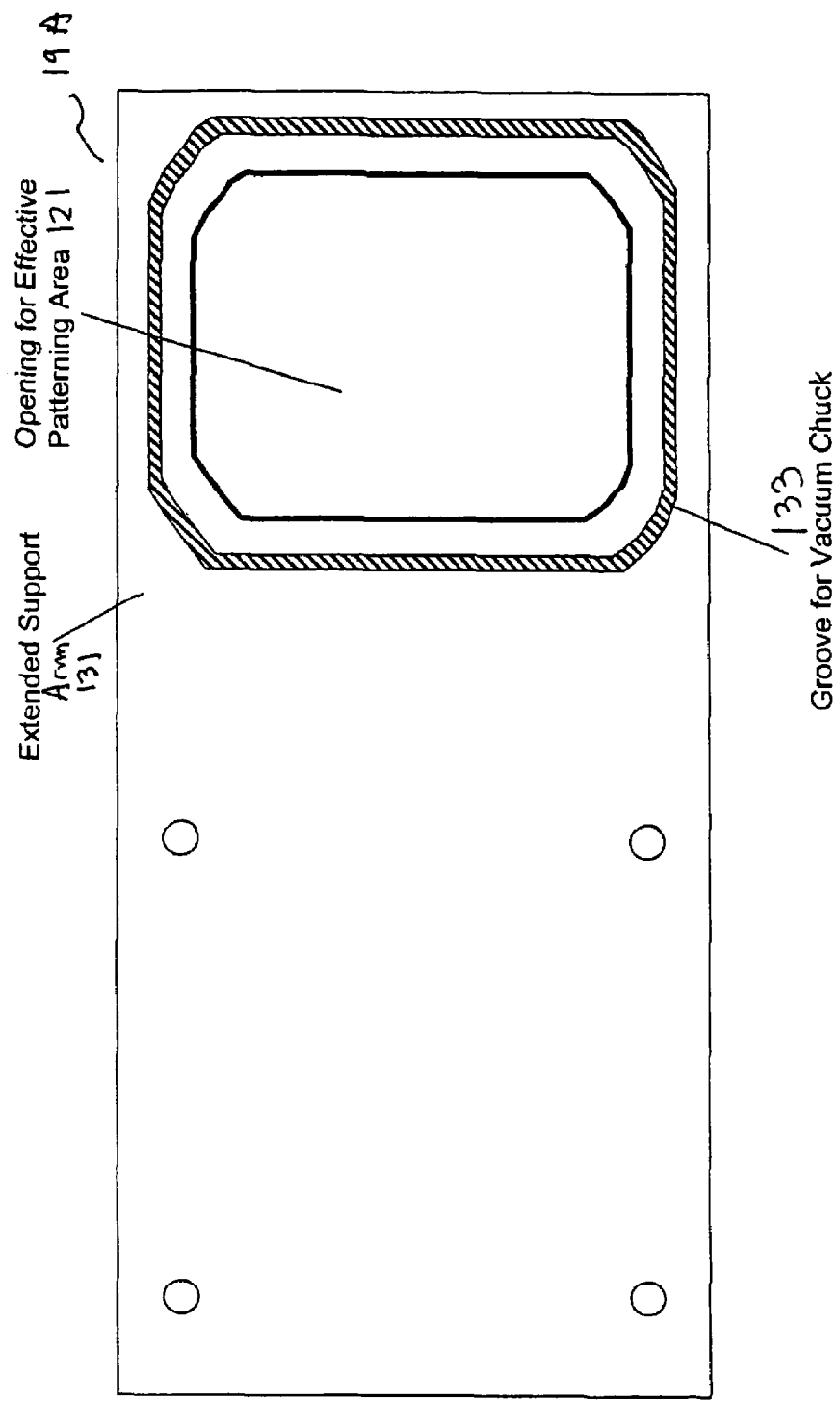
FIG. 13 shows the vacuum chuck of the FIG. 12 embodiment with opening in the extended support.

Another embodiment of the present invention is shown in FIG. 12. In this embodiment, as an alternative to illuminating an auxiliary laser beam onto the LDW plate 15, it is possible to place an auxiliary laser 17A under LDW plate 15 on the vacuum chuck 19A, in which case the auxiliary laser beam strikes LDW plate 15 from its back side. As LDW plate 15 moves with the translation stage 11, the vacuum chuck 19A may have an opening (window) 121 to expose the effective patterning area 121. FIGS. 12 and 13 are a side view and a top view of the system, respectively. An auxiliary laser 17A is set in the space underneath the vacuum chuck 19A with a fold mirror 21A and an objective lens 123 both held by a holder (not shown). The auxiliary laser beam is delivered from the auxiliary laser 17A and passes through shutter 125 to be reflected by fold mirror 21A and converges through objective lens 123 to make a spot on the back side of LDW plate 15. The auxiliary laser beam strikes LDW plate 15 from the back side while the beam from main laser 1 illuminates the front side of LDW plate 15. LDW plate 15 is put on the vacuum chuck 19A so that the silver layer faces upward and the main laser beam comes from the top down to the silver layer. The auxiliary laser beam comes from the back side through the base glass material, which has a certain thickness, e.g., 2.3 mm thickness for 5 inch plates or 6.35 mm thickness for 6 inch plates, to reach the silver layer. Therefore, the auxiliary laser beam may be focused by objective lens 123 so that the focal point is within the thickness of the silver layer.

Figure 14:
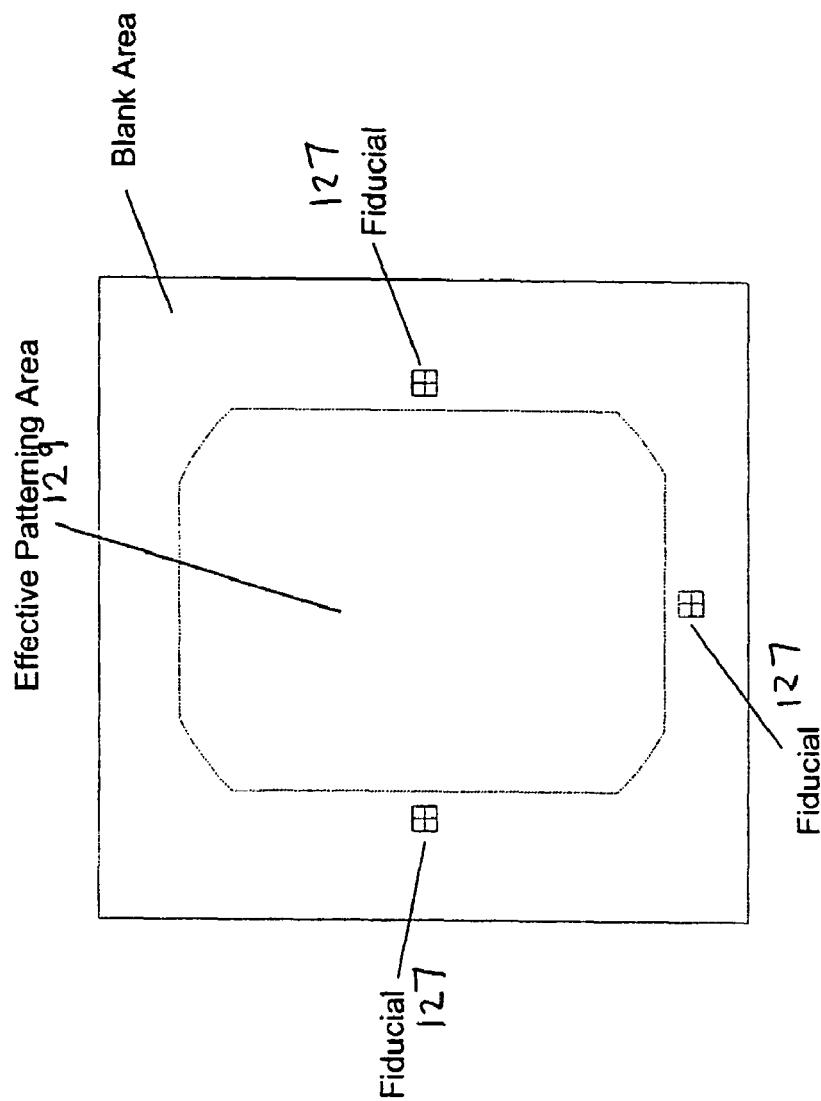
FIG. 14 shows a grayscale photo mask layout with fiducials.

For stepper use, an LDW grayscale photo mask may have an effective area for patterning with a certain size, e.g., 94.3 mm×75.4 mm, spanned from the center of the mask. FIG. 14 shows a mask design with three fiducials 127 and an effective patterning area 129. The fiducials 127 are for alignment of the mask itself against the optical axis of the stepper. The area outside the effective patterning area 129 is not used. The vacuum chuck 19A necessarily has an opening 121 to allow the laser beam to go through. The shape of the opening 121 may be equal to or larger than the effective patterning area 129 of LDW plate 15.

FIG. 13 is an example of the vacuum chuck 19A. The translation stage can not sit below the vacuum chuck 19A. So the vacuum chuck 19A may have an extended support arm 131 being secured on the top part of the translation stage 11 at one edge while the other edge holds LDW plate 15. To avoid vibration and bend of the support arm 131, the support arm 131 may be made with sufficient thickness to provide good rigidity. The vacuum chuck 19A also may have a ring-shaped groove 133 fabricated outside the perimeter of the effective patterning area 129 to suck LDW plate 15, as shown in FIG. 13.

The auxiliary laser 17A can thus sweep in the sense of relative motion inside all effective patterning area 121 from the back side. A mechanical or optical shutter 125 for the auxiliary laser 17A may be used to synchronize with the main laser 1.

Figure 15:
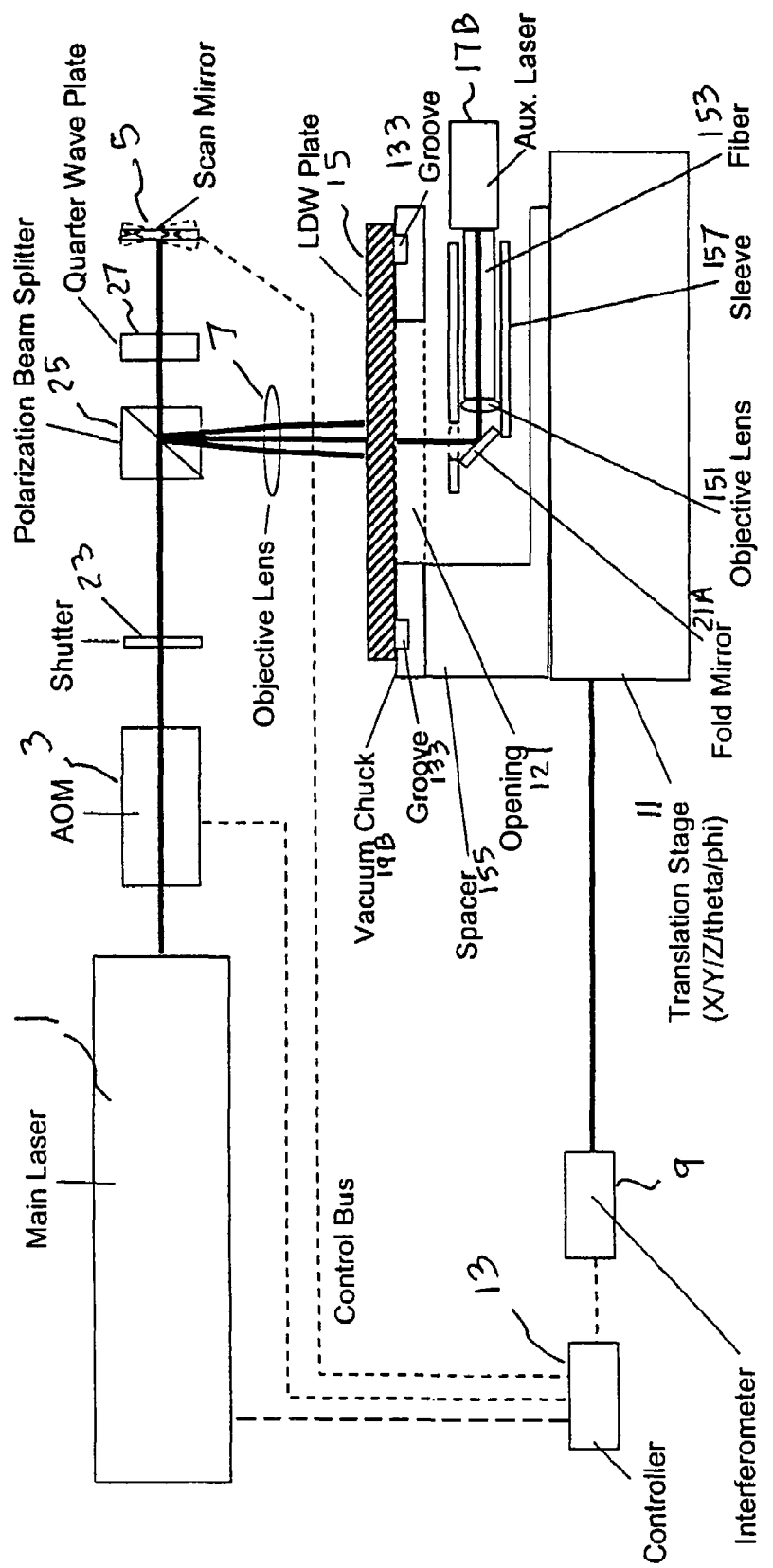
FIG. 15 shows another embodiment of the present invention using a fiber-coupled diode laser.
Figure 16:
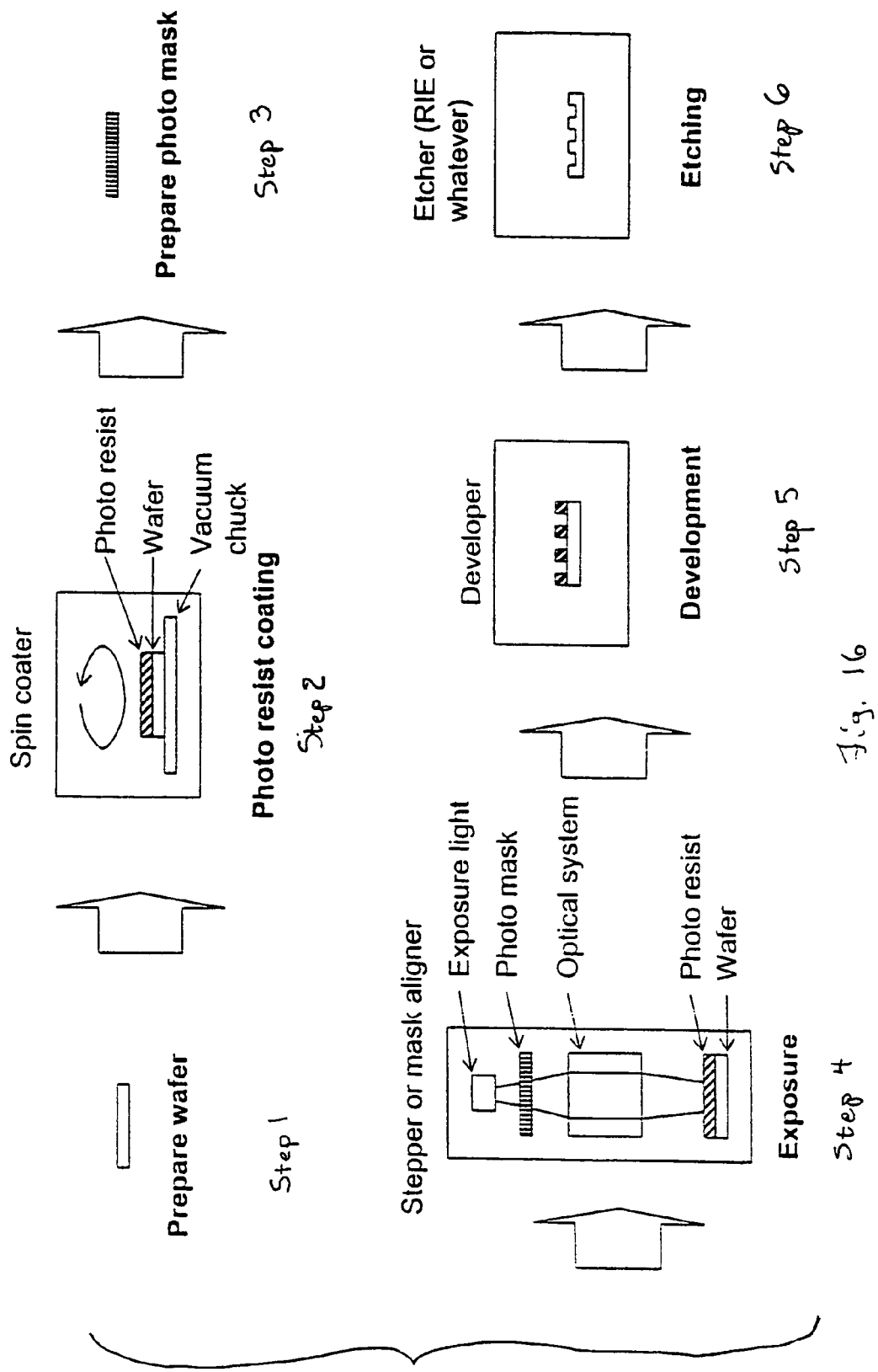
FIG. 16 shows a conventional binary photolithographic process.
Figure 17:
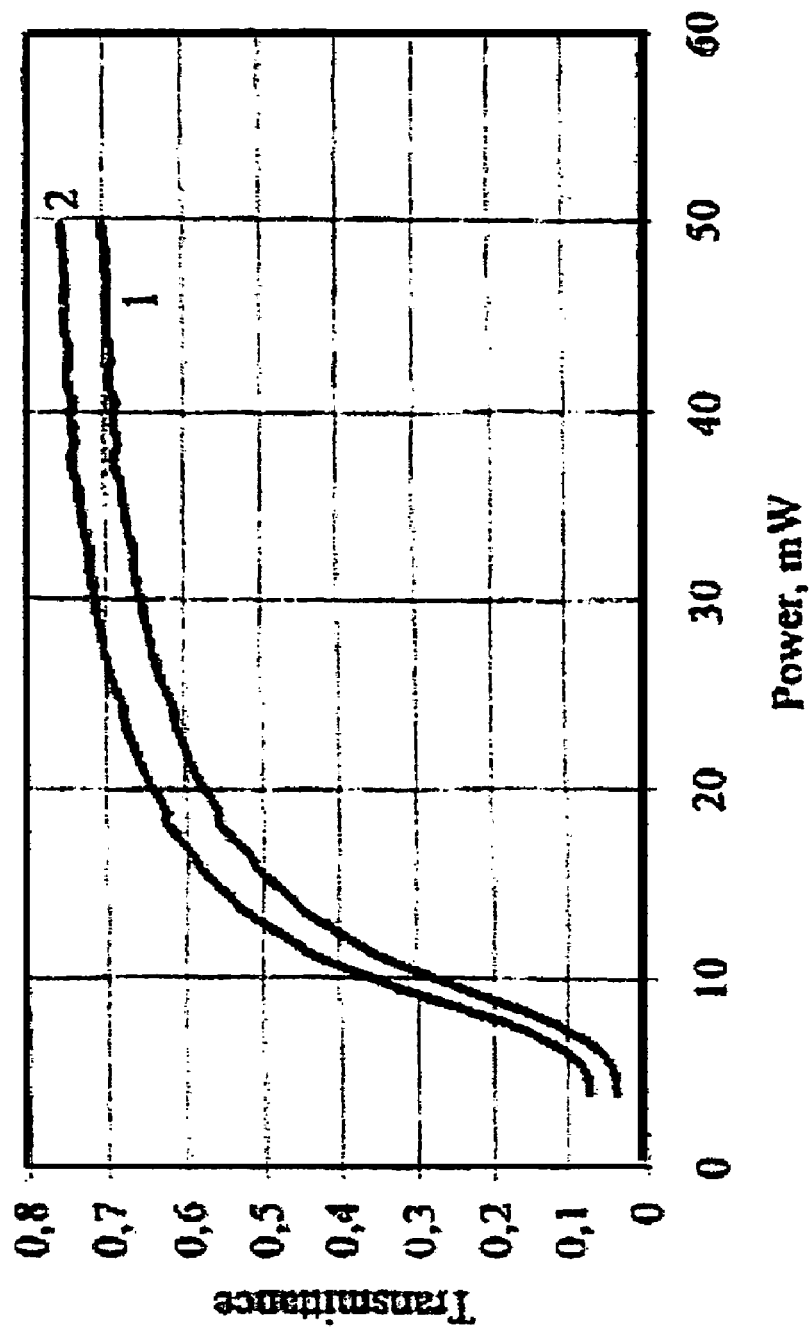
FIG. 17 shows the relation between transmittance and laser power.
Figure 18:
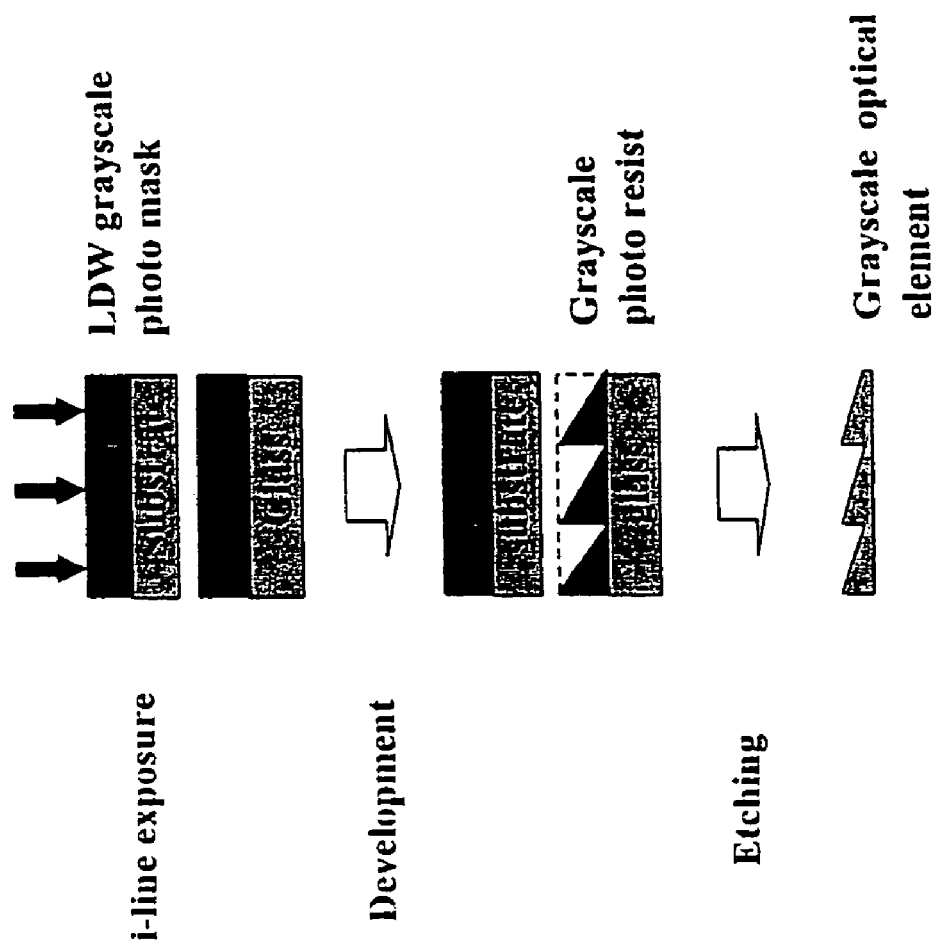
FIG. 18 shows a conventional grayscale photolithographic process.

FIG. 15 illustrates yet another embodiment in which the auxiliary laser is a diode laser 17B coupled to an optical fiber 153 with about 100 to about 200 microns core diameter, for example. A spacer 155 makes a space for the beam path from the fiber-coupled diode laser 17B. The laser beam is delivered through a fiber 153 attached directly to the exit pupil of the diode laser 17B. An objective lens 151 may be attached at the other edge to converge the laser beam. A fold mirror 21A is placed next to the objective lens 151 to reflect the laser beam up to the back side of LDW plate 15. A sleeve 157 is sustains in the space holding the fiber 153 and the fold mirror 21A so that the vacuum chuck 19B can slide together with the translation stage 11 without touching the sleeve 157. The sleeve 157 may be a hollow cylinder, which has an opening on the top portion for the laser beam to go through. The laser beam is focused to make a spot on the silver layer of LDW plate 15. The spacer 155 can alternatively be made by four pillars. A suitable fiber-coupled diode laser is available for example from Coherent, Inc. with a part name Fiber-Coupled single emitter, 810 nm and 2.4 W, part number 1006430.

Although the preferred embodiments of the present invention have been described and disclosed for illustrative purposes, those skilled in the art will appreciate that various modifications, additions, and substitutions are possible, without departing from the scope and spirit of the invention as set forth in the accompanying claims.

What is claimed is:

1. An apparatus for making a grayscale photo mask of a glass material that has a threshold temperature to change characteristics thereof, said apparatus comprising:

a first laser that emits a first laser beam that has a first power;

a modulator that modulates the first power in accordance with pattern data for the grayscale photo mask to produce a first laser beam of modulated power;

a drive section that moves said first laser beam of modulated power over a surface of the glass material; and a second laser that emits a second laser beam onto the glass material, the second laser beam having a second power that generates heat less than an amount capable of causing said glass material to reach said threshold temperature; and a laser control section that controls the first laser and the second laser such that (i) said second laser begins to emit the second laser beam before said first laser begins to emit the first laser beam, (ii) thereafter the glass material is simultaneously exposed to both the first laser beam and the second laser beam, and (iii) a total power of the first laser beam of modulated power and the second power generates heat that is greater than or equal to the amount capable of causing said glass material to reach said threshold temperature, wherein said glass material has a front side and a back side opposing one another, said surface having a first surface portion on said front side and a second surface portion on said back side, said first laser beam impinging on said first surface portion to form a first laser spot and said second laser beam impinging on said second surface portion to form a second laser spot, and said first laser spot and said second laser spot overlapping with one another.

2. The apparatus as in claim 1, wherein said second laser spot is wider than said first laser spot.

3. The apparatus as in claim 1, wherein said second surface portion exposed to said second laser beam includes discrete locations of said back side, and the second power is between about 50 mW and about 5 W.

4. The apparatus as in claim 3, wherein said first surface portion exposed to said first laser beam includes a plurality of locations of said back side, and the first power is between about 20 mW and about 500 mW.

* * * * *